(12) United States Patent
Moore et al.

(10) Patent No.: US 10,197,754 B2
(45) Date of Patent: Feb. 5, 2019

(54) SLIDING THERMAL CONTACT FOR PLUGGABLE OPTIC MODULES

(71) Applicant: Lumentum Operations LLC, Milpitas, CA (US)

(72) Inventors: David Moore, Ottawa (CA); Dean Flockton, Kanata (CA)

(73) Assignee: Lumentum Operations LLC, Milpitas, CA (US)

(*) Notice: Subject to any disclaimer, the term of this patent is extended or adjusted under 35 U.S.C. 154(b) by 0 days.

(21) Appl. No.: 15/295,269

(22) Filed: Oct. 17, 2016

(65) Prior Publication Data
US 2017/0075083 A1 Mar. 16, 2017

Related U.S. Application Data

(63) Continuation of application No. 14/265,595, filed on Apr. 30, 2014, now Pat. No. 9,474,188.
(Continued)

(51) Int. Cl.
| | | |
|---|---|---|
| G02B 6/00 | (2006.01) | |
| G02B 6/42 | (2006.01) | |
| B32B 7/12 | (2006.01) | |
| H05K 7/20 | (2006.01) | |
| B32B 27/28 | (2006.01) | |
| B32B 27/06 | (2006.01) | |
| H05K 9/00 | (2006.01) | |
| H05K 3/30 | (2006.01) | |
| H05K 1/18 | (2006.01) | |

(52) U.S. Cl.
CPC ............ *G02B 6/4269* (2013.01); *B32B 7/12* (2013.01); *B32B 27/06* (2013.01); *B32B 27/281* (2013.01); *G02B 6/428* (2013.01); *H05K 1/18* (2013.01); *H05K 3/301* (2013.01); *H05K 7/20* (2013.01); *H05K 7/2039* (2013.01); *H05K 7/20409* (2013.01); *H05K 7/20418* (2013.01); *H05K 9/0058* (2013.01); *H05K 2201/06* (2013.01); *H05K 2201/066* (2013.01); *H05K 2201/10121* (2013.01); *H05K 2201/10962* (2013.01)

(58) Field of Classification Search
None
See application file for complete search history.

(56) References Cited

U.S. PATENT DOCUMENTS

| | | | |
|---|---|---|---|
| 6,604,575 B1 * | 8/2003 | Degtiarenko | ........... F28F 1/124 165/185 |
| 6,916,122 B2 | 7/2005 | Branch et al. | |
| | | (Continued) | |

FOREIGN PATENT DOCUMENTS

JP      2003174127 A   *   6/2003

*Primary Examiner* — Dimary Lopez Cruz
*Assistant Examiner* — Zhengfu Feng
(74) *Attorney, Agent, or Firm* — Harrity & Harrity, LLP (57) ABSTRACT

Present thermal solutions to conduct heat from pluggable optical modules into heat sinks use a metal heat sink attached with a spring clip. The interface between the pluggable module and the heat sink is simple metal-on-metal contact, which is inherently a poor thermal interface and limits heat dissipation from the optical module. Heat dissipation from pluggable optical modules is enhanced by the application of thermally conductive fibers, such as an advanced carbon nanotube velvet. The solution improves heat dissipation while preserving the removable nature of the optical modules.

20 Claims, 9 Drawing Sheets

Related U.S. Application Data (60) Provisional application No. 61/817,382, filed on Apr. 30, 2013.

(56) References Cited

U.S. PATENT DOCUMENTS

| | | |
|---|---|---|
| 7,132,161 B2 | 11/2006 | Knowles et al. |
| 7,416,019 B2 * | 8/2008 | Osiander ................ B82Y 30/00 |
| | | 165/96 |
| 8,220,530 B2 | 7/2012 | Cola et al. |
| 8,535,787 B1 * | 9/2013 | Lima ......................... B32B 7/12 |
| | | 165/185 |
| 9,474,188 B2 | 10/2016 | Moore et al. |
| 2004/0266065 A1 | 12/2004 | Zhang |
| 2005/0195565 A1 * | 9/2005 | Bright ................ H05K 7/20418 |
| | | 361/688 |

* cited by examiner

SLIDING THERMAL CONTACT FOR PLUGGABLE OPTIC MODULES

CROSS-REFERENCE TO RELATED APPLICATIONS

This application is a continuation of U.S. patent application Ser. No. 14/265,595, filed Apr. 30, 2014 (now U.S. Pat. No. 9,474,188), which claims priority from U.S. Provisional Patent Application No. 61/817,382, filed Apr. 30, 2013, the disclosures of which are incorporated herein by reference.

TECHNICAL FIELD

The present invention relates to an optical module, and in particular to a sliding heat sink for a pluggable optical module.

BACKGROUND OF THE INVENTION

Figure 1:
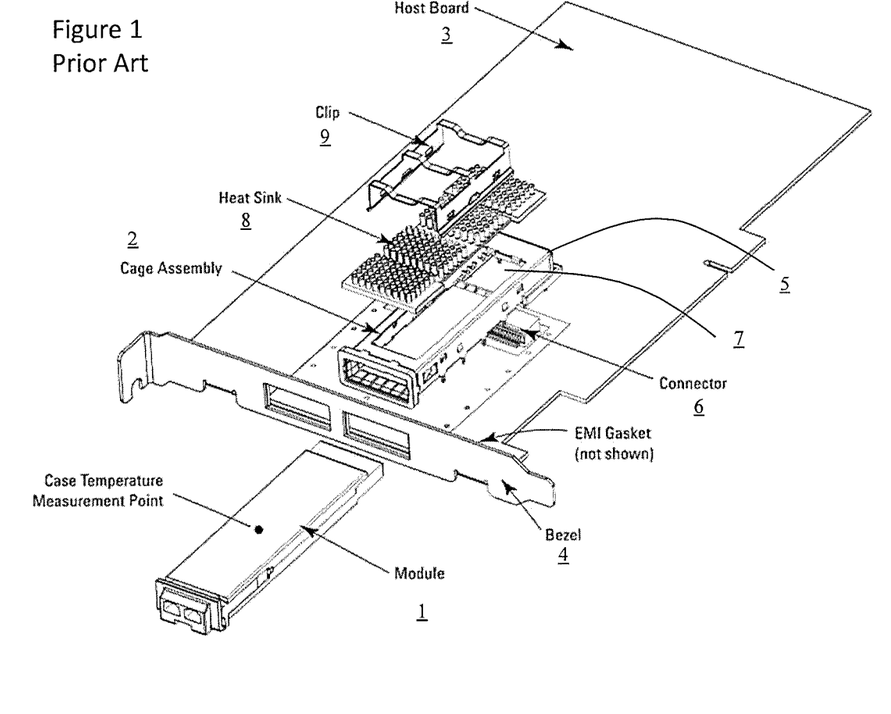
FIG. 1 is an exploded view of a conventional optical module cage system.

Conventionally, optical transceivers with data rates up to 4 Gb/s are packaged in small form factor (SFF or SFP) packages, while optical transceivers with higher data rates, e.g. 10 Gb/s, are in larger packages, such as XFP, X2, and XENPAK. A conventional XFP arrangement is illustrated in FIG. 1, in which an XFP transceiver module 1 is plugged into a host cage assembly 2 mounted on a host circuit board 3. The host cage assembly 2 includes a front bezel 4, a cage receptacle 5, and a host electrical connector 6. The transceiver module 1 is inserted through an opening in the front bezel 4, and through an open front of the cage receptacle 5, until an electrical connector on the transceiver module 1 engages the host electrical connector 6. The cage receptacle 5 has an opening 7 in the upper wall thereof through which a heat sink 8 extends into contact with the transceiver module 1 for dissipating heat therefrom. A clip 9 is provided for securing the heat sink 8 to the cage receptacle 5 and thereby into contact with the transceiver module 1. With this arrangement, the heat sink 8 can be changed to suit the owner's individual needs without changing the basic transceiver module 1.

Examples of conventional heat sinks are disclosed in U.S. Pat. No. 6,916,122 issued Jul. 12, 2005 in the name of Branch et al.

Pluggable optic module thermal dissipation requirements are increasing with the continued advancement of features and performance. 10 Gb/s modules with added features, e.g. EDC, tenability etc., have increased the power density of pluggable optics, and speed increases to 40 Gb/s and 100 Gb/s are pushing power densities even higher. A fundamental problem for all pluggable (removable) optical modules in telecom systems is that the need to make them removable limits the thermal conduction path. Improvements to the thermal conduction path will reduce the need for faster cooling air speeds or larger heat sinks, which are not always capable of keeping the modules within the operating temperature ranges specified.

The most common approach to connecting a heat sink to a pluggable optical module is the use of the MSA-suggested heat sink 8, which clips to the cage 2 using the spring clip 9. The spring clip 9 enables the heat sink 8 to move slightly, i.e. up and down, side to side, forwards and back, when the pluggable optic module 1 is inserted/extracted, while maintaining a tight interface between the surface of the module 1 and the heat sink 8. However, the surfaces of the heat sink 8 and the pluggable optic module 1 are made of hard, non-conforming metal. This metal-to-metal contact is the weak link in the thermal path. Microscopic imperfections in the heat sink 8 and surfaces on the module 1 limit the flow of heat across the interface. Thermal contact resistance causes large temperature drops at the interfaces, which negatively affect the thermal performance of the system. Thermal management can be significantly better if there are no high resistance interfaces in the system.

In non-sliding applications a thermal interface material, e.g. gel, is often used to improve the thermal interfaces by filling the imperfections and improving heat flow. However, in a sliding application, e.g. pluggable optics modules (SFP, SFP+, GBIC, XFP, XENPAK, XPAK, X2) traditional thermal interface materials are undesirable because the thermal interface for pluggable optics is transient in nature. Modules will be extracted and inserted multiple times. Thermal interface materials leave residue on modules as they are removed, they dry out when no module is present (shipping) and are generally awkward to apply.

An object of the present invention is to overcome the shortcomings of the prior art by providing heat-sinking pluggable optical modules which addresses the need to be able to insert and remove MSA standard or other optical modules. The solution provides greatly improved thermal conductivity between the optical module and the heat sink within the system.

SUMMARY OF THE INVENTION

Accordingly, the present invention relates to a cage assembly mountable on a printed circuit board for receiving an optical module comprising:

a cage for slidably receiving the optical module;

an electrical connector mountable on the printed circuit board for electrically connecting the optical module to the printed circuit board; and a heat sink assembly mounted on the cage for dissipating heat from the optical module, the heat sink assembly comprising:

a thermally conductive heat sink separated from the optical module by a gap; and a first thermal interface mounted on an underside of the heat sink, including thermally conductive fibers extending across the gap into the cage for contacting the optical module.

Another aspect of the present invention relates to an optical module for sliding into a cage assembly, which includes a cage, a first electrical connector with an opening in an upper wall, and a heat sink assembly mounted on the cage over the opening, comprising:

a housing defining a gap with the heat sink assembly when inserted in the cage;

optical and electrical components disposed in the housing for converting optical signals into electrical signals and electrical signals into optical signals;

a second electrical connector extending from the housing for connection to the first electrical connector;

an optical connector extending from the housing; and a second thermal interface mounted on the housing including thermally conductive fibers for extending through the opening and across the gap into contact with the heat sink assembly for dissipating heat from the housing.

Another feature of the present invention provides an optical system including:

the aforementioned cage assembly; and the aforementioned optical module;

wherein the thermally conductive fibers from each of the first and second thermal interfaces have a length between 0.6× and 1.0× a width of the gap between the optical module and the heat sink for engaging each other.

BRIEF DESCRIPTION OF THE DRAWINGS

The invention will be described in greater detail with reference to the accompanying drawings which represent preferred embodiments thereof, wherein.

DETAILED DESCRIPTION

Figure 2:
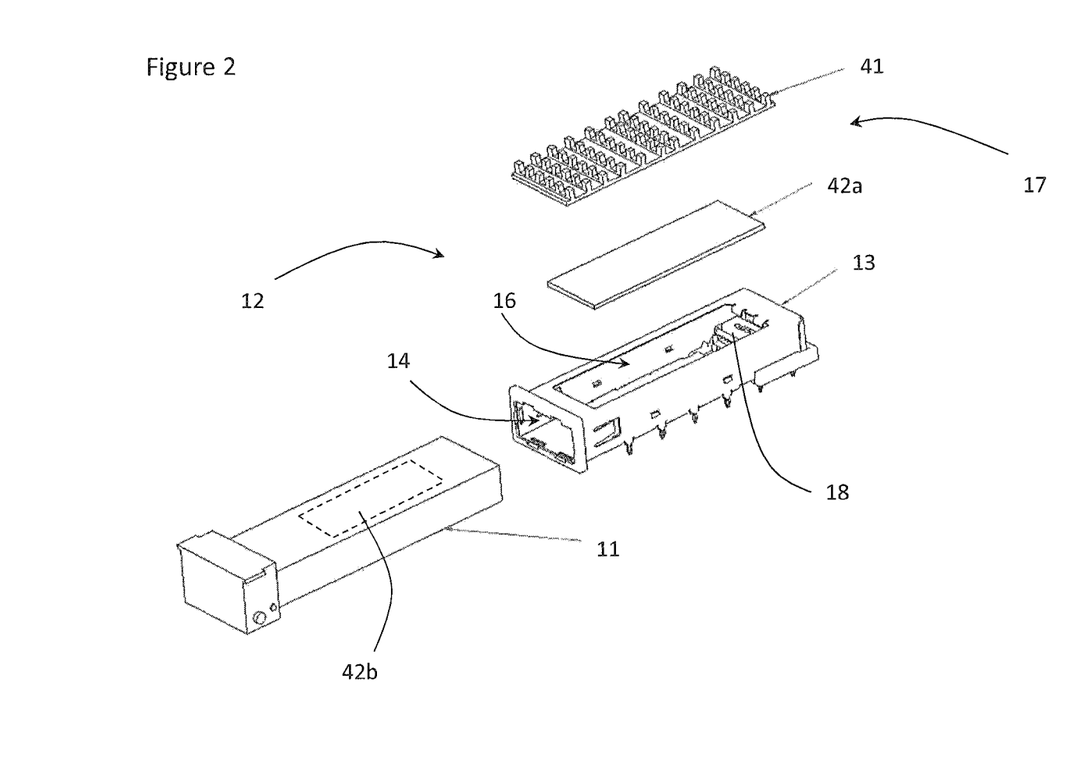
FIG. 2 is an exploded view of an optical module cage system in accordance with the present invention.
Figure 3:
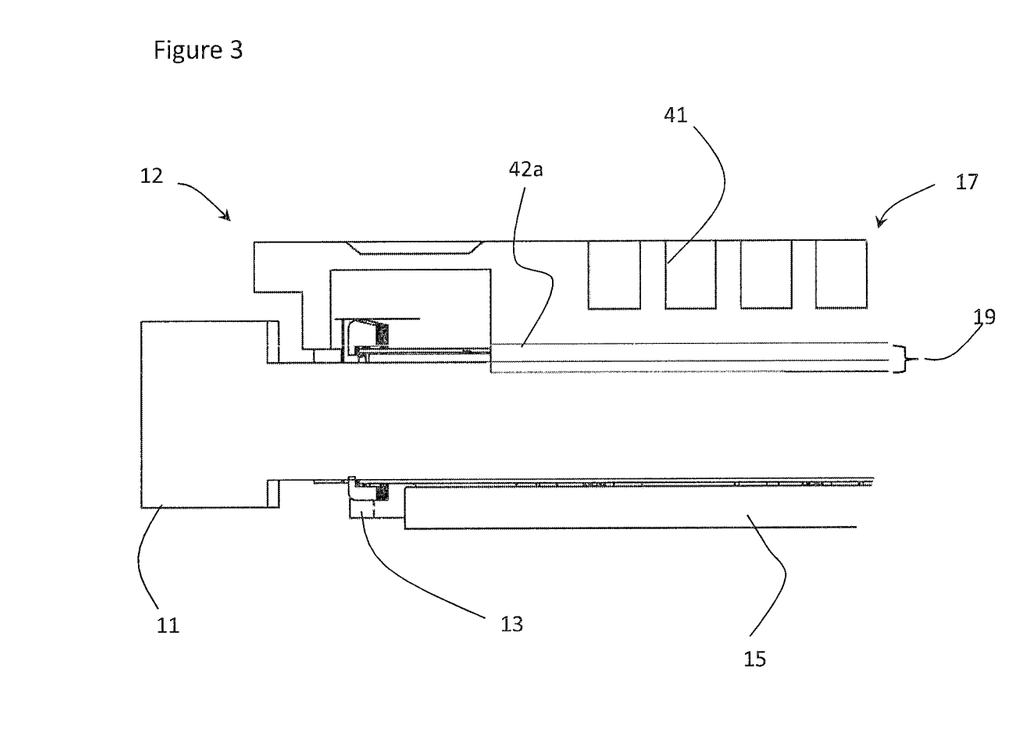
FIG. 3 is a cross-section view of the optical module cage system of FIG. 2.

With reference to FIGS. 2 and 3, the present invention relates to a cage assembly 12 for receiving a pluggable optical module 11. The cage assembly 12 includes a rectangular, metal cage 13, as is known in the prior art, mounted on a printed circuit board 15, as in FIG. 1. The cage 13 includes a first opening 14 in a front wall for receiving the pluggable optical module 11, and a second opening 16 in an upper wall for receiving a heat sink assembly 17. The second opening 16 is at least half of the area of the upper wall, and preferably at least ¾ of the area of the upper wall, e.g. up to 90% of the area of the upper wall. An electrical connector 18 is mounted in the cage 13 on the printed circuit board for receiving a mating electrical connector on the pluggable optical module. The printed circuit board 15 includes trace electrical connectors for electrically connecting the connector 18 to a host computer system, within which the printed circuit board 15 is received.

Figure 4:
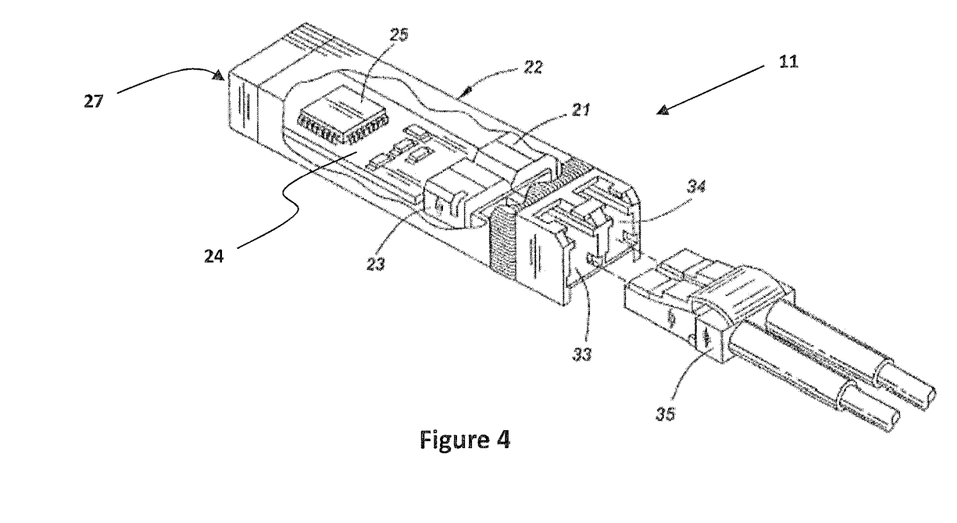
FIG. 4 is an isometric view of optical module.

The optical module, e.g. SFP, SFP+, GBIC, XFP, XEN-PAK, XPAK, X2, CFP, CFP2, CFP4, or QSFP transceiver, generally indicated at 11 in FIG. 4, typically includes a ROSA 21 mounted in a housing 22 alongside a TOSA 23. A PCB 24 includes TOSA and ROSA control and monitoring circuitry, e.g. chip 25. An electrical connector 27 extends from a rear end of the housing 22 for mating with a host mounted electrical connector 6. For a pluggable transceiver the electrical connector 27 includes a card edge connector formed in the end of the PCB 24. Bores 33 and 34 form an optical connector on a front end of the housing 22 for receiving an duplex optical connector. Other types of electro/optical modules are possible.

The heat sink assembly 17 includes any conventional heat sink 41, comprised of metal or other suitable thermally conductive material, preferably with a plurality of thermally conductive fins or fingers extending upwardly therefrom, enabling cooling air to pass over, around and between. The heat sink assembly 17 also includes a first sliding thermal interface 42a in the form of a velvet or brush comprised of a plurality of thermally conductive whiskers, filaments or fibers disposed between the housing of the optical module 11 and the heat sink 41, whereby the whiskers, filaments or fibers extend through the second opening 16 and across gap 19 between the optical module 11 and the heat sink 41. In an alternate embodiment a second sliding thermal interface 42b is mounted on the optical module 11, in place of or in conjunction with the first sliding thermal interface 42a, whereby the whiskers, filaments or fibers extend upwardly from the optical module 11 through the second opening 16 into contact with the heat sink assembly 17, i.e. the first sliding interface 42a or all the way to the heat sink 41, if the first sliding interface 42a is absent.

Ideally, the heat sink assembly 17 covers the entire area of the second opening 16, and the first (or second) sliding thermal interfaces 42a and/or 42b covers at least 50% of the second opening 16, preferably at least 75% and more preferably up to 90%. Typically, each fiber is between 3 and 12 um in diameter, with a packing density of from 0.1% to 24%, preferably 3% to 15%, and more preferably 4% to 6%. Typically, the velvet 42a and/or 42b has a thermal conductivity greater than 500 W/m$^2$K, preferably between 1000 and 10,000 W/m$^2$K, and more preferably about 2000 to 5000 W/m$^2$K. Ideally, carbon nanotubes (FIG. 5) are used, which provide excellent thermal conductivity while maintaining mechanical compliance. Examples of carbon nanotubes are found in U.S. Pat. No. 7,416,019 issued Aug. 26, 2008 in the name of Osiander et al, and U.S. Pat. No. 8,220,530 issued Jul. 17, 2012 in the name of Cola et al, which are incorporated herein by reference.

Figure 5:
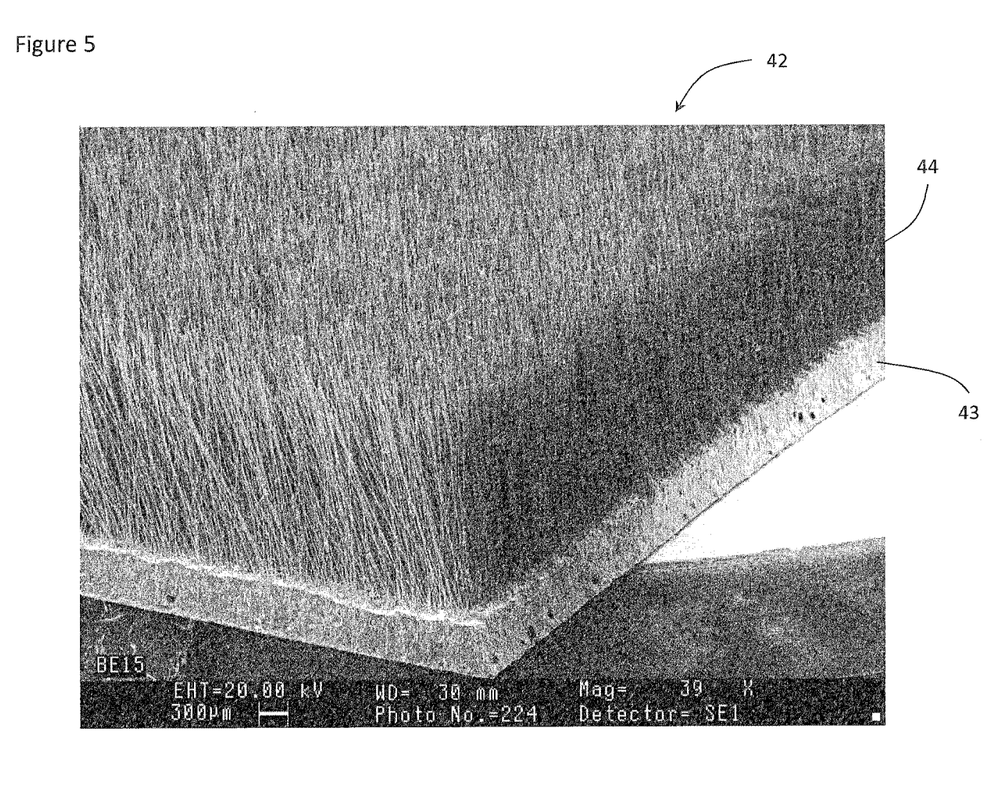
FIG. 5 is a perspective view of a heat dissipating velvet of the optical module cage system of FIG. 2.

With reference to FIG. 5, ideally, the "velvet" 42a and/or 42b is comprised of carbon nanotubes in the form of a foil substrate 43 with an array of carbon nanotubes 44. The preferred embodiment uses a specifically designed carbon nanotube velvet to connect the pluggable optical module 11 to a heat sink 41. The many fibers in the velvet 42a and/or 42b can move independently to fill the voids in the surfaces of the pluggable optic module 11 to improve the heat flow therebetween. The independent and flexible nature of the fibers also enables the surfaces to slide while still maintaining thermal contact. The improved contact lowers the temperature of the pluggable module 11 more than the standard metal-on-metal contact of the MSA-specified heat sink design shown in FIG. 1.

In the primary embodiment of the invention, the velvet 42a is mounted on the heat sink 41 of the cage system 12 into which the pluggable optic module 11 is being inserted, In this particular application, the carbon nanotube array 44 can be a velvet called VEL-THERM® procured from ESLI (Energy Science Laboratories, Inc.) disclosed in U.S. Pat. No. 7,132,161 issued Nov. 7, 2006 to Knowles et al, which is incorporated herein by reference. The velvet 42 must be precut (die cut) to the precise size required to extend through the second opening 16 in the optical module cage 13. The thickness of the velvet 42a or 42b is precisely controlled to provide optimal contact with the pluggable optic 11 for optimization of both thermal performance and the insertion and removal of the module 11. Typically, the thickness of the velvet 42a or 42b is larger than the gap 19, e.g. 1.2 mm, between the module 11 and the heat sink 41. Preferably, the thickness of the velvet 42a or 42b is between 1.5× and 2.0× the width of the gap 19, e.g. 1.8 mm to 2.4 mm, and ideally 1⅔× the width of the gap 19, e.g. 2 mm.

Another important consideration is the control of stray carbon nanotubes. Every effort is made to ensure that the pre-cut velvet 42a and/or 42b have no loose carbon nanotube fibers, which could dislodge and interfere with the electrical operation of the circuit board 15 on which the optical module 11 is placed. An additional precaution is the application of an electrically insulating coating to the velvet 42a and/or 42b, which reduces or eliminates any electrical conductivity of the velvet 42a and/or 42b. A coating, such as a Parylene coating, improves fiber retention, but most importantly reduces the electrical conductivity of loose individual fibers, whereby detached fibers would not fall onto the printed circuit board 15 and short circuit any electrical circuitry.

Another limitation of the MSA-specified heat sink 8 is that one heat sink can only be applied to one pluggable module 1, i.e. one heat sink 8 cannot be used to cool multiple pluggable modules 1. This is due to the floating nature of the MSA-specified design. When attached to a single pluggable optic module 1, the heat sink spring clip 9 can account for any tolerance mismatch and maintain contact between the heat sink 8 and the pluggable module 1. But when additional pluggable modules 1 are added, it is impossible to contact all of the surfaces due to standard tolerance variation.

Figure 6:
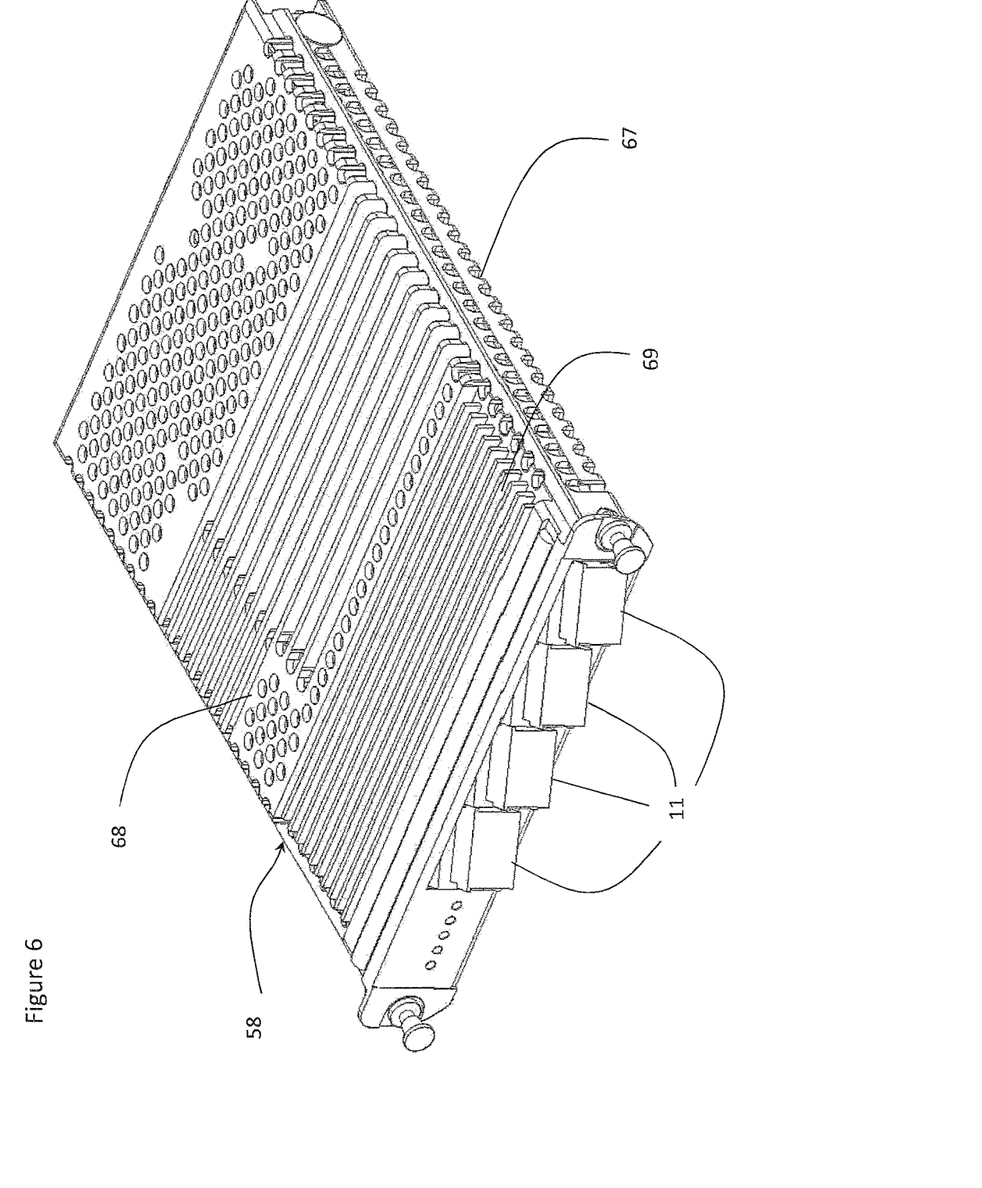
FIG. 6 is a isometric view of a second embodiment of the present invention in which a single heat sink is utilized for a plurality of optical module cage systems.
Figure 7:
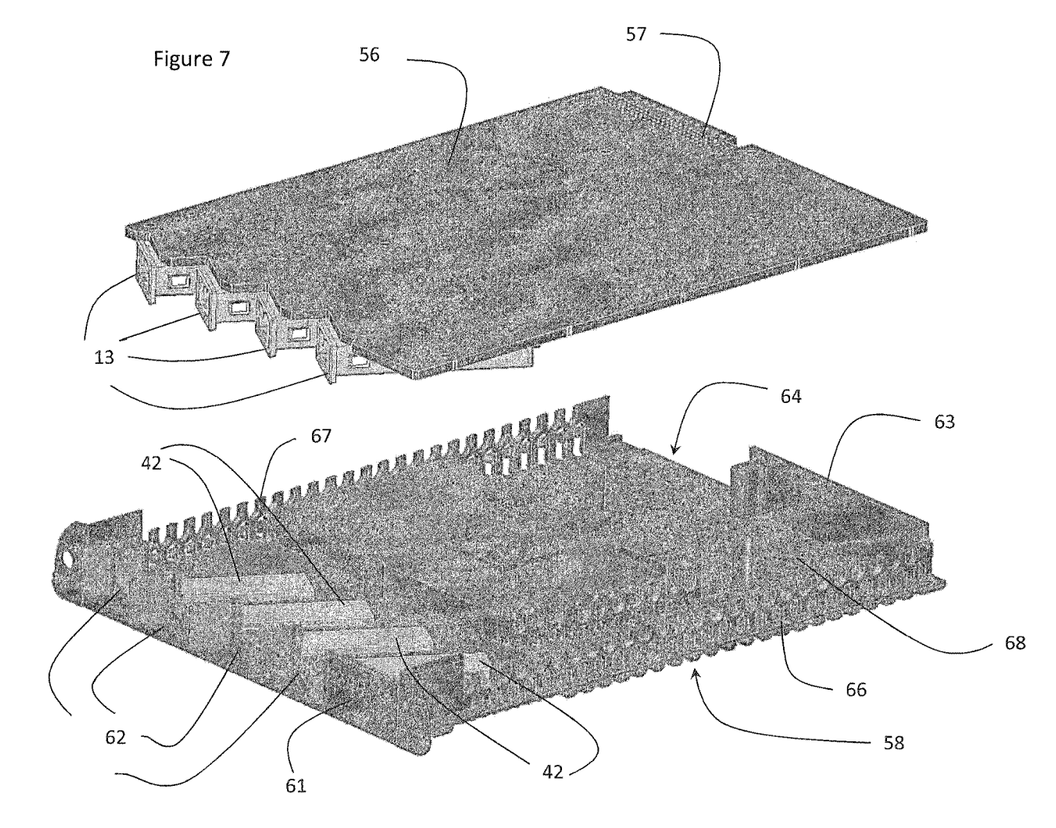
FIG. 7 is an exploded view of the optical module cage system of FIG. 6.

With reference to FIGS. 6 and 7, the use of brushes or velvets 42a and or 42b, e.g. carbon fiber nanotubes, eliminates the need for the heat sink 8 to move because the individual fibers accommodate the variations in the surfaces of the heat sink and the optical modules 11. Therefore, a plurality of pluggable optic cages 13 can be mounted on a single printed circuit board 56, with a combined electrical connector 57 for connection to a host device (not shown). Accordingly, only a single stationary heat sink 58 can be used to dissipate heat from each and every one of a plurality of optical modules 11 received within the cages 13. One or both of the velvets 42a and/or 42b is provided for each module 11, either mounted on the heat sink 58 or on each module 11 or both. The heat sink 58 can cover just the area above the cages 13 or it can cover, and provide protection and heat dissipation, for the entire printed circuit board 56.

In the illustrated multi-unit embodiment of FIGS. 6 and 7, the heat sink 58 includes a front wall 61 including a plurality of apertures 62 providing access to the openings 14, and a rear wall 63 including an access port 64 through which the combined electrical connector 57 extends. Side walls 66 and 67, preferably include an array of openings, enabling air to circulate through the side walls and over the electrical elements on the printed circuit board 56. The upper wall 68 of the heat sink 58 includes a series of fins or fingers 69 in the area over top of the cages 13, i.e. velvets 42a, for increased heat dissipation. Additional vent openings and/or heat dissipating fins or fingers can also be provided over top of the other sections of the printed circuit board 56, as required by their thermal dissipation needs, such as required for any processors, FPGA's and memory chips provided in the multi-unit module.

Some pluggable optic modules are not designed for heat sinks. In these cases, the pluggable optic module is inserted into a cage on the PCBA. There is a gap between the pluggable module and the cage that inhibits the flow of heat. Placing carbon fiber nanotube velvet between the pluggable optic module and the cage will create thermal contact between the parts and promote heat flow. This can be accomplished by attachment of the velvet to both or either of the optical module and the cage.

Figure 8:
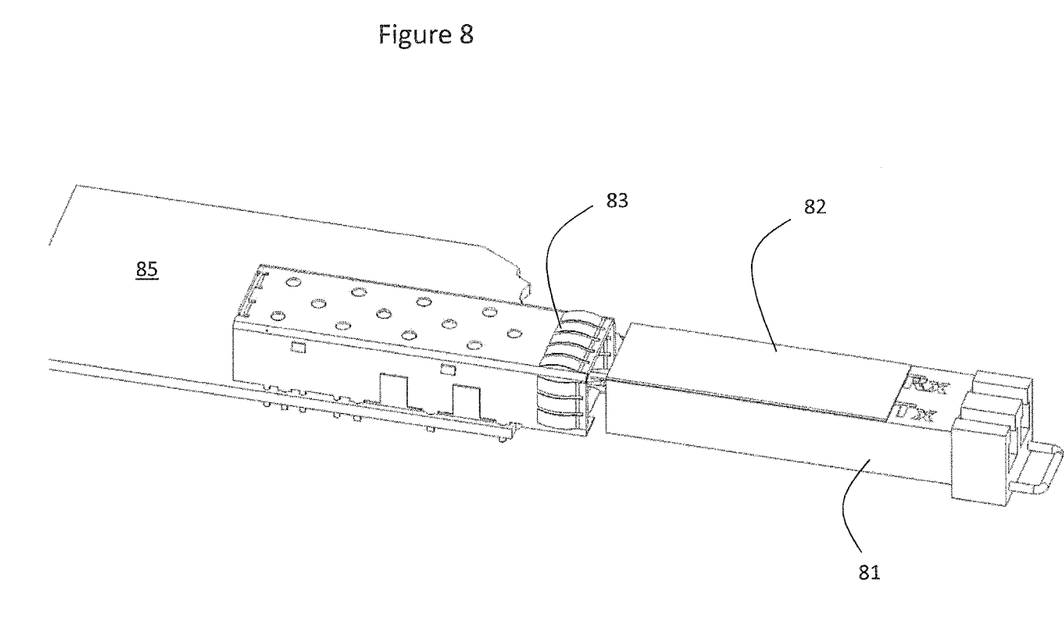
FIG. 8 is an isometric view of a third embodiment of the present invention in which the velvet is mounted on the optical module.
Figure 9:
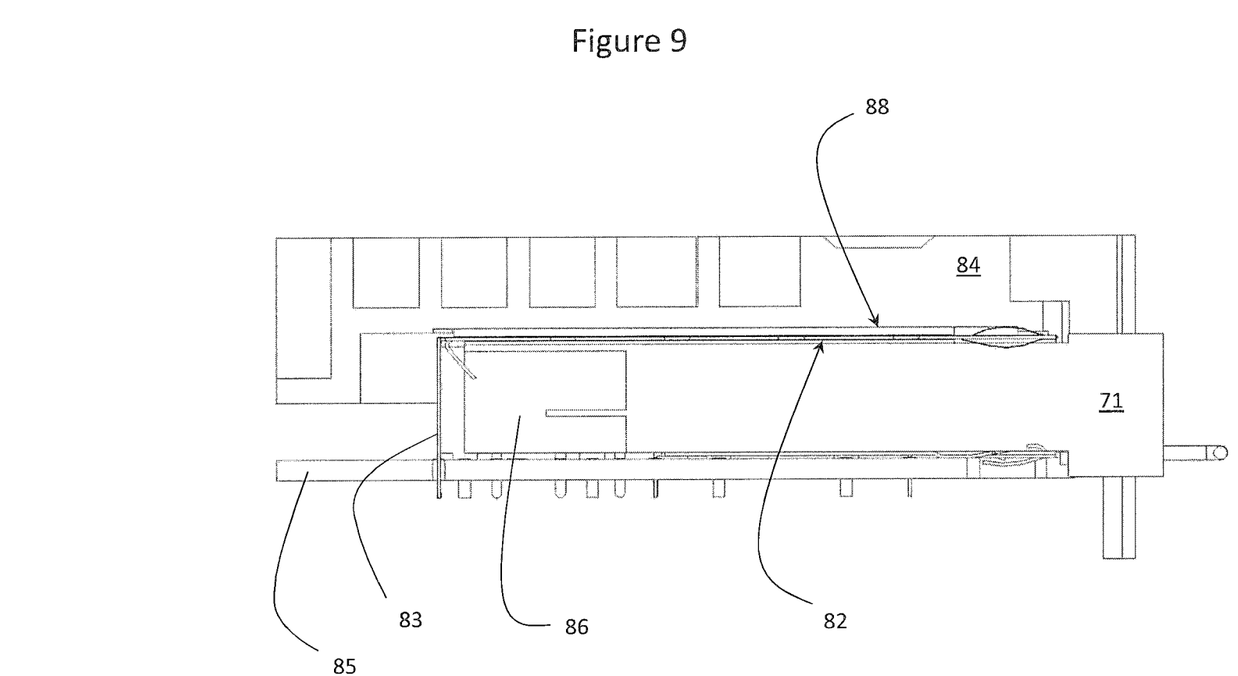
FIG. 9 is an isometric view of a fourth embodiment of the present invention in which velvets are mounted on both the optical module and the heat sink.

Accordingly, in another embodiment of the invention, illustrated in FIGS. 8 and 9, an optical module 81, e.g. SFP, is insertable into a cage 83, which is mounted on a printed circuit board 85 including an electrical connector 86. A velvet 82 is mounted directly on the upper surface of a pluggable optical module 81 or on the inside surface of the upper wall of the cage 83, so that the velvet 82 extends between the optical module 81 and the cage 83, i.e. across the gap therebetween. A heat sink 84 is mounted on the outer surface of the upper wall of the cage 83, whereby heat is conducted from the optical module 71 through the velvet 82, through the upper wall of the cage 83 to the heat sink 84. A second velvet or a conventional thermally conductive material 88, e.g. gel or pad, can be added between the cage outer surface of the upper wall of the cage 83 and the heat sink 84 to enhance thermal conductivity. Accordingly, the heat sink assembly includes The materials and dimensions of the velvet 82 are the same as those of the velvet 42, relative to the gap between the optical module 71 and the cage 83, e.g. preferably 0.1× to 2.0× the gap, more preferably 1.5× to 2.0× the gap, and most preferably 1.66× the gap. Ideally, the velvet 82 covers over 25%, preferably greater than 50%, and more preferably greater than 75% of the upper surface of the optical module 81 or the inside surface of the upper wall of the cage 83.

We claim:

1. A cage assembly comprising:
   a cage for receiving an optical module;
   a thermally conductive heat sink mounted outside the cage; and
   a thermal interface including thermally conductive fibers mounted inside the cage,
      wherein an insulating coating is located on the thermally conductive fibers, and
      other thermally conductive fibers extend through an opening in the cage.

2. The cage assembly of claim 1, wherein the thermal interface is mounted on an underside of the thermally conductive heat sink.

3. The cage assembly of claim 1, wherein the thermally conductive heat sink covers at least half of the opening of the cage.

4. The cage assembly of claim 1, wherein the opening has an area of at least half of an area of a surface of the cage.

5. The cage assembly of claim 1, further comprising:
   an electrical connector mountable on a printed circuit board for electrically connecting the optical module to the printed circuit board.

6. The cage assembly of claim 1, further comprising:
   a plurality of additional cages for receiving a plurality of additional optical modules, respectively; and
   a plurality of additional thermal interfaces, each of the plurality of additional thermal interfaces including thermally conductive fibers for extending into contact with a respective optical module of the plurality of additional optical modules.

7. An optical module comprising:
   a housing;
   an electrical connector extending from the housing;
   an optical connector extending from the housing; and
   a thermal interface, mounted on the housing, including thermally conductive fibers,
      wherein an insulating coating is located on the thermally conductive fibers, and
      wherein the thermally conductive fibers extend upward from the optical module for extending through an opening in a cage.

8. The optical module of claim 7, further comprising:
   optical and electrical components disposed in the housing, for converting optical signals into electrical signals and electrical signals into optical signals.

9. The optical module of claim 7, wherein the optical module engages with the cage.

10. The optical module of claim 9, wherein the cage is part of a cage assembly that includes a heat sink.

11. The optical module of claim 7, wherein the thermally conductive fibers engage with a heat sink.

12. The optical module of claim 7, wherein the thermal interface includes carbon nanotubes.

13. An optical system including:
a cage assembly comprising:
 a cage for receiving an optical module;
 a thermally conductive heat sink mounted outside the cage; and
 a first thermal interface including first thermally conductive fibers mounted inside the cage; and
the optical module comprising:
 a second thermal interface, mounted on an exterior of the optical module, including second thermally conductive fibers,
  wherein an insulating coating is located on the second thermally conductive fibers, and
  wherein the second thermally conductive fibers extend upward from the optical module and through an opening in the cage.

14. The optical system of claim 13, further comprising:
an insulating coating located on the first thermally conductive fibers.

15. The optical system of claim 13, wherein
the thermally conductive heat sink covers at least half of the opening of the cage.

16. The optical system of claim 13, wherein at least one of the first thermal interface or the second thermal interface includes carbon nanotubes.

17. The optical system of claim 13, wherein at least one of the first thermal interface or the second thermal interface includes a foil substrate.

18. The optical system of claim 13, wherein the first thermally conductive fibers extend into contact with the second thermally conductive fibers.

19. The optical system of claim 13, wherein the optical module further comprises:
optical and electrical components for converting optical signals into electrical signals and electrical signals into optical signals.

20. The optical system of claim 13, wherein the first thermal interface is mounted on an underside of the thermally conductive heat sink.

* * * * *